United States Patent

Elms

[19]

[11] Patent Number: 5,487,016
[45] Date of Patent: Jan. 23, 1996

[54] APPARATUS FOR GENEARTING A SIGNAL REPRESENTATIVE OF TOTAL HARMONIC DISTORTION IN WAVEFORMS OF AN A/C ELECTRICAL SYSTEM

[75] Inventor: Robert T. Elms, Monroeville, Pa.

[73] Assignee: Eaton Corporation, Cleveland, Ohio

[21] Appl. No.: 334,506

[22] Filed: Nov. 4, 1994

[51] Int. Cl.⁶ .................................................. G01R 23/00
[52] U.S. Cl. ........................................... 364/484; 324/623
[58] Field of Search ............................... 364/481–487,
364/575–577; 324/623, 620, 626, 76.21,
76.11, 76.12, 132; 340/660, 658; 327/101

[56] References Cited

U.S. PATENT DOCUMENTS

| | | | |
|---|---|---|---|
| 4,258,314 | 3/1981 | Hirata | 324/620 |
| 4,267,515 | 5/1981 | Tervi et al. | 327/101 |
| 4,672,555 | 6/1987 | Hart et al. | 364/483 |
| 4,774,454 | 9/1988 | Yamaguchi et al. | 324/623 |
| 4,918,381 | 4/1990 | Bender et al. | 324/76.21 |
| 4,964,055 | 10/1990 | Grassel et al. | 364/485 |
| 5,072,187 | 12/1991 | Shilo | 324/623 |
| 5,144,226 | 9/1992 | Rapp | 324/132 |
| 5,170,114 | 12/1992 | Lowenstein et al. | 324/623 |
| 5,260,647 | 11/1993 | Swerlein | 324/76.12 |
| 5,298,888 | 3/1994 | McEachern | 364/483 |
| 5,300,924 | 4/1994 | McEachern et al. | 364/483 |
| 5,343,404 | 8/1994 | Girgis | 364/484 |
| 5,365,164 | 11/1994 | Lowenstein et al. | 364/485 |

Primary Examiner—James P. Trammell
Attorney, Agent, or Firm—Martin J. Moran

[57] ABSTRACT

A microprocessor based device for generating a representation of the total harmonic distortion in an ac waveform derives from digital samples of the waveform a fundamental signal representing the value of the fundamental frequency component of each sample. A harmonic signal is then generated as the difference between the sample value and the fundamental component of the sample. An output signal representing total harmonic distortion is then generated as the ratio of the RMS value of the harmonic signal to the RMS value of the fundamental signal converted to a percentage.

7 Claims, 2 Drawing Sheets

APPARATUS FOR GENEARTING A SIGNAL REPRESENTATIVE OF TOTAL HARMONIC DISTORTION IN WAVEFORMS OF AN A/C ELECTRICAL SYSTEM

BACKGROUND OF THE INVENTION

1. Field of the Invention

This invention relates to harmonic distortion analysis of waveforms in an A/C electrical system and, in particular, to an apparatus method by which a total harmonic distortion signal of reasonable accuracy can be repetitively generated without undue signal processing.

2. Background Information

There is increasing use of loads which can distort the sinusoidal waveforms, especially the current waveforms, in A/C power systems, and particularly, in power distribution systems. As such waveform distortion can adversely affect the equipment of other users on the system, and the revenues of the utility supplying the power, there is increased emphasis on locating the sources of and reducing the effects of such distortion.

It is well known to quantify the distortion in sinusoidal waveforms through harmonic analysis. Harmonic analysis is based on the principal that any periodic waveform can be characterized as the sum of a sine wave at the fundamental frequency and sine waves at harmonics of the fundamental frequency. One standard measure of harmonic distortion is individual harmonic distortion. This is a measure of the distortion attributable to a specific harmonic. Individual harmonic distortion is measured as the RMS value of the particular harmonic as a percentage of the RMS value of the fundamental frequency. Another standard measure of harmonic distortion is the total harmonic distortion. Typically, total harmonic distortion is calculated as the ratio of the square root of the sum of the squares of the RMS values of the individual harmonics not including the fundamental to the RMS value of the fundamental converted to a percentage.

Thus, the typical total harmonic calculation requires calculation of the individual harmonics. As is well known, the values of the harmonics and the fundamental frequency component can be extracted from digital samples of the A/C waveform by use of Fourier analysis. This analysis produces sine and cosine coefficients for the fundamental and each of the harmonics to be analyzed. In many applications there is interest in the magnitudes of a large number of harmonics, for instance, up to the fiftieth harmonic. Compounding the problem is the fact that a waveform must be digitally sampled at twice the frequency of the highest harmonic to be extracted. Therefore, in order to extract the fiftieth harmonic from a waveform with 60 Hz fundamental frequency, sampling must be performed at 6 KHz. It can be appreciated then that analyzers must have processors which can sample at the high sampling rate needed to extract the desired harmonics, and can also perform the extensive calculations required for the Fourier analysis. Typically, analyzers sample for one or a few cycles and then suspend sampling while the harmonic coefficients are calculated. This technique degrades the ability of the analyzer to catch transients in the waveforms. Some analyzers trigger the high speed sampling required for harmonic analysis upon detection of specific events, thereby capturing the portion of the waveform of interest.

In an effort to reduce the burden on the analyzer processor, an approximation has been used for determining total harmonic distortion. This approximation calculates the square root of the difference between the square of the RMS value of the total signal minus the square of the RMS value of the fundamental divided by the RMS value of the fundamental and converted to a percentage. Thus, this approximation only requires the calculation of the harmonic coefficients for the fundamental frequency. However, when this approximation is used, the result is obtained by taking the square root of the difference between two numbers. If the total harmonic distortion is a small percent, high precision of the two numbers generating the difference is required. As an example, a one percent THD where the fundamental frequency is 100 Hz is the square root of (10001-10000). This implies that an accuracy of about 0.01 percent in the measurement and calculation of the waveform values is required to obtain a one percent THD accuracy.

There is a need for an improved apparatus for determining harmonic distortion in A/C waveforms.

More particularly, there is a need for an improved apparatus for determining total harmonic distortion in an A/C waveform which reduces the burden on a digital processor generating the total harmonic distortion signal from digital samples of the waveform.

There is also a need for such an improved apparatus which generates an approximation of total harmonic distortion in an ac waveform rapidly yet with a reasonable accuracy.

SUMMARY OF THE INVENTION

These and other needs are satisfied by the invention which is directed to apparatus for approximating the total harmonic distortion (THD) in an ac waveform from the RMS value of the signal minus its fundamental component. More particularly, the instantaneous value of the fundamental component of the signal is calculated and subtracted from the instantaneous value of the signal. The RMS value of that difference is then calculated, divided by the RMS value of the fundamental and converted to a percentage to produce the approximation of the THD.

In accordance with the invention, means are provided for generating a sensed signal which is representative of the ac waveform. Means are also provided for generating from the sensed signal a fundamental signal representative of the fundamental frequency component of the sensed signal. Additional means generate a harmonics signal as a difference between the sensed signal and the fundamental signal. Means then generate a total harmonic distortion signal from the harmonic signal and the fundamental frequency signal. More particularly, the latter means includes means which generates the RMS value of the harmonic signal and divides it by the RMS value of the fundamental frequency signal and converts the quotient to a percentage. In particular, the invention is carried out by a digital system which generates digital samples of the waveform, determines the fundamental frequency component for each sample, and subtracts that fundamental frequency component from the digital sample value to generate a digital harmonic signal. The RMS value of this digital harmonic signal is then determined and divided by the RMS value of the fundamental frequency component.

Generation of a THD signal in accordance with the invention is more accurate than the approximation technique described above. If the harmonic signal is maintained to an accuracy of ½% of the RMS value of the signal, THD values should be accurate to about 1%. Thus, this technique is more tolerant of sampling and timing errors than the approximate "technique" described in the background, however, it requires more calculation steps or about twice the execution time. On the other hand, this technique requires much less execution time than is needed for calculating the "exact" THD, e.g., 1/25 of the execution time where 50 harmonics are used in the "exact" calculation.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
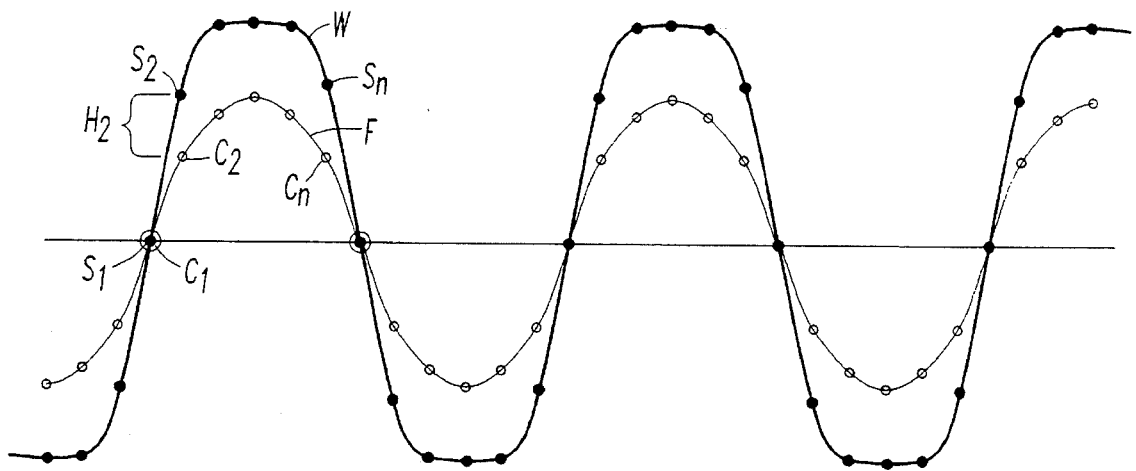
FIG. 1 is a waveform diagram illustrating the manner in which the THD of a waveform is determined in accordance with the invention.

Referring to FIG. 1, an ac waveform W is shown which is somewhat squared indicating that it has significant harmonic content. The waveform is sampled at sample points S equally spaced in time. As discussed above, the waveform is sampled at a rate at least twice the frequency of the highest harmonic to be detected in order to satisfy the Nyquist criteria. Thus, for a waveform with a fundamental frequency of 60 Hz, sampling would be carded out at least 6 KHz in order to extract up to the 50th harmonic. That would mean that 100 samples per cycle of a 60 Hz signal would have to be taken to extract the 50th harmonic. However, in determining total harmonic distortion in accordance with the present method, it is not necessary to be able to separately identify the individual contribution of each harmonic. Thus, in the exemplary embodiment of the invention, the THD calculations are made from samples taken at 32 samples per cycle of the 60 Hz waveform W. For purposes of clarity of illustration, however, a fewer number of samples per cycle are shown in FIG. 1. Also, it should be noted that in FIG. 1 samples are shown taken at the zero crossings of the waveform W. This is not necessary. It is necessary, however, that the sampling be synchronous. That is, an integer number of samples should be taken per cycle. This is necessary in order to perform a Fourier analysis. This well known mathematical technique is used to produce a sine and a cosine coefficient for the fundamental frequency component F of the waveform W. These coefficients are used to calculate from the samples $S_1, S_2, \ldots S_n$ taken of the waveform W, the corresponding values of each of the sample points of the fundamental frequency component F of the waveform W. These calculated values of the fundamental frequency component are indicated by the reference characters $C_1$ to $C_n$.

A digital signal H representing the harmonics is generated by taking the difference between the measured sampled values of the waveform W and the calculated value of the fundamental component. The total harmonic distortion is then calculated as the RMS value of this digital harmonic signal H divided by the RMS value of the fundamental frequency component F.

This approximation of the THD is represented by the following relationship:

$$THD = \left( \frac{1}{m} \Sigma_{k=1}^{m} (f(k) - f_1(k))^2 \right)^{1/2} / F_1 \qquad \text{Eq. 1}$$

wherein f(k)=the measured sample value of the waveform W at sample point k.

f1(k)=the calculated value of the fundamental component F at the sample point k.

m=number of samples per cycle.

k=sample number.

It can be seen from this formula that, first of all, only the fundamental component of the waveform needs to be calculated. All of the harmonics are contained in the measured value of the waveform and are extracted as a group by subtracting the value of the fundamental waveform from the corresponding sample value of the measured waveform. It can also be seen from the above formula that it does not require taking the square root of the difference between the two squared numbers as did the prior art "approximation" of THD.

Figure 2:
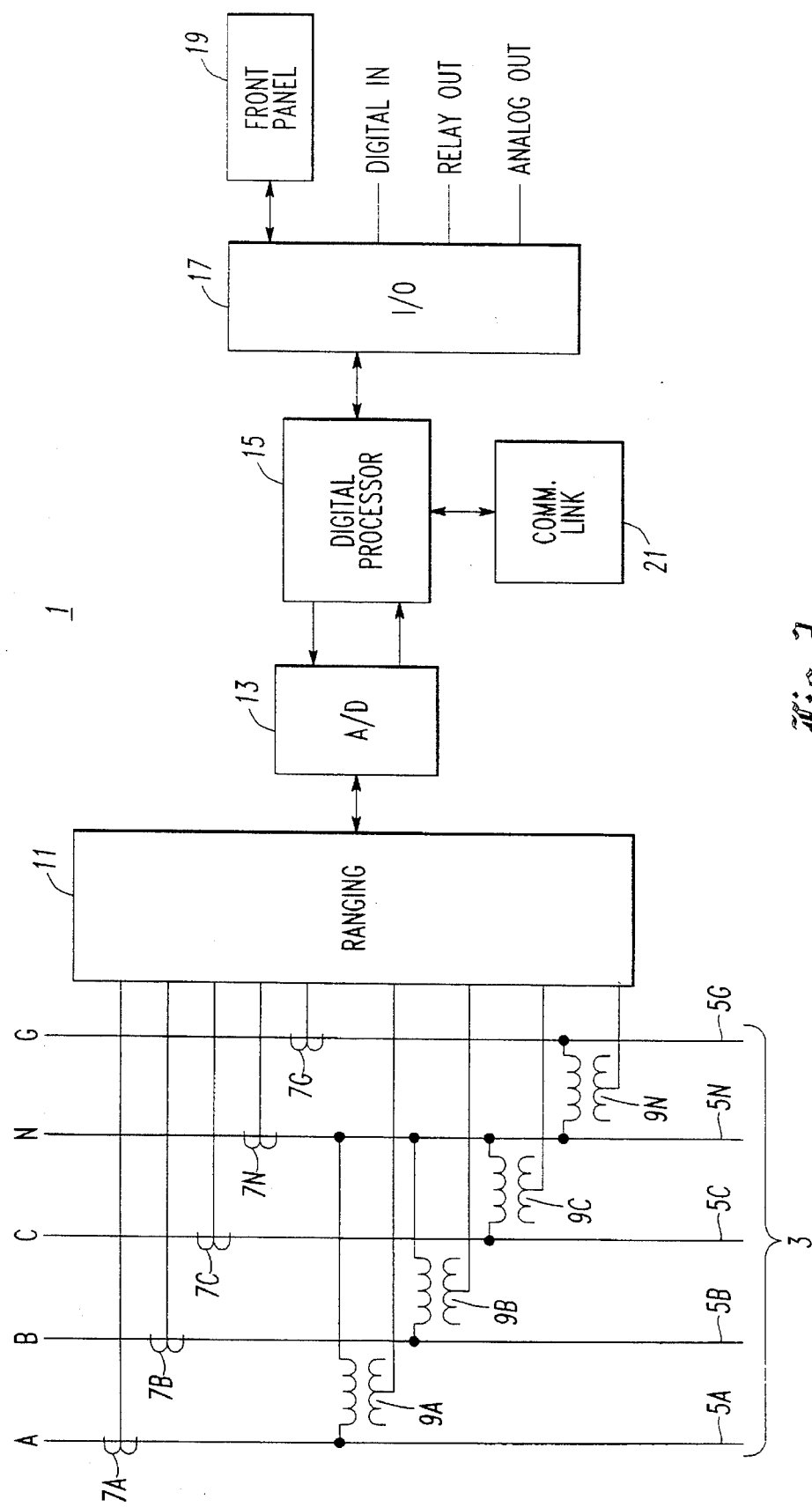
FIG. 2 is a block diagram of a monitor/analyzer adapted for generating a signal representative of the THD in accordance with the invention.

FIG. 2 illustrates a monitor/analyzer 1 which can be used to generate a THD output in accordance with the invention. The monitor/analyzer 1 is shown connected to an ac electric power system 3 such as a power distribution system for analyzing waveforms in the system.

Current transformers 5A, B, C, N and G sense current flowing in each of these conductors while phase to neutral voltages are sensed by the potential transformers 9A, B, and C, and neutral to ground voltage is sensed by transformer 9N. A ranging circuit 11 converts the current and the voltage signals from −10 to 0 to +10 volt signals for conversion by analog to digital (A/D) converter 13 for input to a digital processor 15. The A/D converter 13 samples the analog voltages and currents at sampling rates determined by interrupts generated by the digital processor 15. These interrupts are generated selectively at a first, slow speed sampling rate, or a second, high speed sampling rate. In the exemplary device, the slow speed sampling rate is 32 samples per cycle and the high speed rate is 128 samples per cycle. During low speed sampling, the A/D converter 13 samples all five currents and all four voltages. For high speed sampling, again all currents are sampled, but only the three phase voltages are digitized for input to the processor. Each of these currents and voltages is sampled on each interrupt.

The digital processor 15 utilizes the data generated by these digital samples to generate values of two sets of electrical parameters. The first set of parameters is related to the monitoring function and includes metered parameters such as: rms currents and voltages, peak currents and voltages, minimum currents and voltages, power factor, watts, Vars, volt-amps, total harmonic factor, K-factor, CBMEA derating factor, and the like. The second set of parameters calculated by the digital processor 15 are the individual harmonic coefficients. The present invention organizes data collection and processing so that a maximum number of parameters can be monitored continuously while also providing the capability for simultaneous calculation of harmonic content.

The digital processor 15 has an input/output (I/O) 17 through which the processor 15 is connected to a front panel 19. The front panel 19 serves as the interface with the user. It is through the front panel that the user can control the operation of the monitor/analyzer 1 and monitor the ac electrical power system 3. The input/output device 17 also interfaces the digital processor 15 with contact inputs through a digital input. Relay outputs and analog outputs are also provided through the input/output device 17. The digital processor 15 can also communicate with a remote processor through a communications link 21. Through this communications link 21 the monitor/analyzer 1 can provide information to and/or be controlled by a remote processor (not shown).

The THD output of the monitor/analyzer 1 can be a numerical readout on the front panel 19. In addition, or instead, the THD output can be communicated to a remote device over the communications link 21. It will be appreciated that the monitor/analyzer 1 can also, if desired, determine the individual harmonic content of waveforms in the distribution system 3. This is described in the cross-referenced patent application. The analyzer switches to a faster sampling rate, 128 samples per cycle in the exemplary analyzer, in order to have data appropriate for calculating up to the 50th harmonic. That analyzer uses a sampling scheme in which samples are normally taken at 32 samples per cycle, but samples can be taken at 128 samples per cycle for two consecutive cycles out of each eight cycles.

Figure 3:
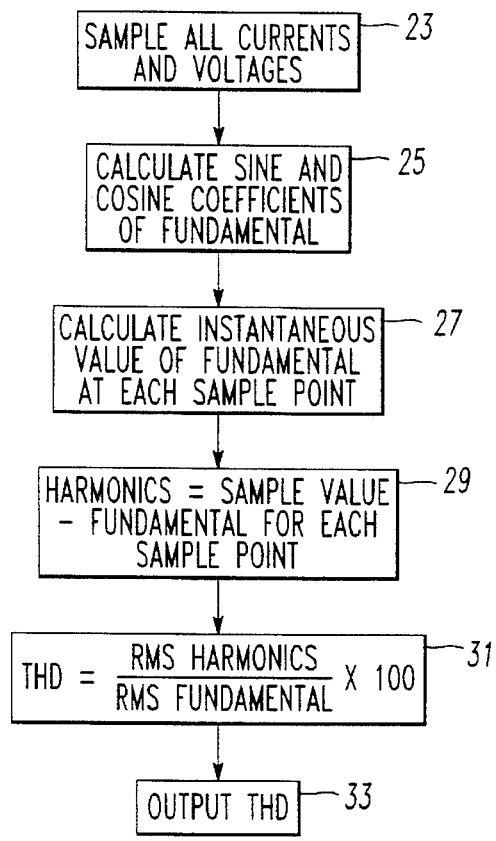
FIG. 3 is a flow chart of a suitable computer program implemented by the monitor/analyzer of FIG. 2 to generate a THD output.

FIG. 3 illustrates a flow chart of a routine used by the processor 15 in order to generate the THD output. As indicated at 23, samples are taken 32 times per cycle of all 5 currents and 4 line to neutral voltages (line to line voltages are line to neutral voltages, as is well known). The sine and cosine coefficients of the fundamental component of each of the currents and voltages are then calculated at 25 using Fourier analysis, as is also well known. These coefficients are then used at 27 to calculate the instantaneous value of the fundamental of each of the waveforms at each of the sample points. This value of the fundamental of each of the waveforms at each of the sample points is then subtracted from the measured value of the waveform at 29 to generate the harmonic signal. These harmonic signals and the fundamental components are then used to calculate the THD values for each of the currents and voltages in accordance with the above Equation 1. These THD values are then output at 33 for presentation to the user of the analyzer/monitor.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for generating a signal representative of total harmonic distortion in an ac waveform having a fundamental frequency, said apparatus comprising:

sensing means generating a sensed signal representative of said ac waveform;

means generating from said sensed signal a fundamental signal representative of a fundamental frequency component of said sensed signal;

means generating a harmonics signal as a difference between said sensed signal and said fundamental signal; and means generating a total harmonic distortion signal from said fundamental signal and said harmonics signal.

2. The apparatus of claim 1 wherein said means generating said total harmonic distortion signal comprises means generating an RMS harmonics signal from said harmonics signal, generating an RMS fundamental signal from said fundamental signal, and generating said total harmonic distortion signal as a ratio of said RMS total harmonics signal to said RMS fundamental signal and converted to a percentage.

3. Apparatus for determining total harmonic distortion in a waveform of an ac power distribution system, said apparatus comprising:

sensing means for generating a digital sensed signal from digital samples taken of said waveform at digital sampling points;

fundamental signal generating means generating from said digital sensed signal a digital fundamental signal representing a fundamental frequency component of said ac waveform at said digital sampling points in said ac waveforms;

harmonic signal generating means generating a digital harmonic signal as a difference between said digital sensed signal and said digital fundamental signal at said digital sampling points;

total harmonic distortion signal generating means generating a digital total harmonic distortion signal from said digital harmonic signal and said digital fundamental signal; and output means generating an output from said digital total harmonic distortion signal.

4. The apparatus of claim 3 wherein said total harmonic distortion signal generating means generating said digital total harmonic distortion signal comprises means generating a digital RMS harmonic signal from said digital harmonic signal at said digital sampling points, means generating an RMS fundamental signal from said digital fundamental signal, and means generating said digital total harmonic distortion signal as a ratio of said RMS harmonic signal to said RMS fundamental signal expressed as a percentage.

5. The apparatus of claim 3 wherein said total harmonic distortion signal generating means generating said total harmonic distortion signal generates said total harmonic distortion signal in accordance with the following relationship:

$$THD = \left( \frac{1}{m} \Sigma_{k=1}^{m} (f(k) - f_1(k))^2 \right)^{1/2} / F_1 \qquad \text{Eq. 1}$$

wherein:

m = number of samples per cycle.

k = sample number.

f(k) = sample value at sample k.

$f_1(k)$ = fundamental value of sample k.

$F_1$ = RMS value of fundamental component.

6. The apparatus of claim 3 wherein said sensing means comprises means generating a plurality of digital sensed signals from digital samples taken of multiple waveforms in said ac distribution system at digital sampling points in each of said multiple waveforms, wherein said fundamental signal generating means comprises means generating from each of said plurality of digital sensed signals a corresponding digital fundamental signal representative of a fundamental frequency component of a corresponding digital sensed signal, wherein said harmonic signal generating means generates a corresponding digital harmonic signal for each waveform as a difference between the digital sensed signal for the waveform and a corresponding digital fundamental signal for the waveform, and wherein the total harmonic distortion signal generating means comprises means generating a total harmonic distortion signal for each of said waveforms from said digital harmonic signal for the waveform and the corresponding digital fundamental signal for the waveform.

7. The apparatus of claim 6 wherein one of said multiple waveforms is a current waveform and another of said multiple waveforms is a voltage waveform and wherein a fundamental frequency signal and a harmonic signal are generated for said current waveform and said voltage waveform and wherein a total harmonic distortion signal is generated for said current waveform and said voltage waveform.

* * * * *